United States Patent
Nimmakayala et al.

(10) Patent No.: US 7,880,872 B2
(45) Date of Patent: Feb. 1, 2011

(54) INTERFEROMETRIC ANALYSIS METHOD FOR THE MANUFACTURE OF NANO-SCALE DEVICES

(75) Inventors: Pawan Kumar Nimmakayala, Austin, TX (US); Tom H. Rafferty, Austin, TX (US); Alireza Aghili, Austin, TX (US); Byung-Jin Choi, Austin, TX (US); Philip D. Schumaker, Austin, TX (US); Daniel A. Babbs, Austin, TX (US); Van Nguyen Truskett, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/576,030

(22) Filed: Oct. 8, 2009

(65) Prior Publication Data
US 2010/0038827 A1 Feb. 18, 2010

Related U.S. Application Data

(63) Continuation of application No. 11/000,321, filed on Nov. 30, 2004, now Pat. No. 7,630,067.

(51) Int. Cl.
*G01B 11/26* (2006.01)
(52) U.S. Cl. .................... 356/139.04; 356/139.05; 356/139.07
(58) Field of Classification Search ........ 356/3.01–3.15, 356/4.01–4.1, 5.01–5.15, 6–22, 28, 28.5, 356/139.01–139.1
See application file for complete search history.

(56) References Cited

U.S. PATENT DOCUMENTS

| 3,783,520 A | 1/1974 | King |
| 4,070,116 A | 1/1978 | Frosch et al. |
| 4,256,829 A | 3/1981 | Daniel |
| 4,326,805 A | 4/1982 | Feldman et al. |
| 4,444,801 A | 4/1984 | Hongo et al. |
| 4,512,848 A | 4/1985 | Deckman et al. |
| 4,600,309 A | 7/1986 | Fay |
| 4,707,611 A | 11/1987 | Southwell |

(Continued)

FOREIGN PATENT DOCUMENTS

JP 55-88332 7/1980

(Continued)

OTHER PUBLICATIONS

Arai et al., Development of a New Parallel Manipulator with Fixed Linear Actuator, In Proceedings of Japan/USA Symposium on Flexible Automation, vol. 1, ASME, New York, pp. 145-149 Jan. 1, 1996.

(Continued)

*Primary Examiner*—Thomas H Tarcza
*Assistant Examiner*—Luke D Ratcliffe
(74) *Attorney, Agent, or Firm*—Laura C. Robinson

(57) ABSTRACT

The present invention features a method to determine relative spatial parameters between two coordinate systems, which may be a mold and a region of a substrate in which mold is employed to generate a pattern. The method includes sensing relative alignment between the two coordinate systems at multiple points and determines relative spatial parameters therebetween. The relative spatial parameters include a relative area and a relative shape.

20 Claims, 9 Drawing Sheets

U.S. PATENT DOCUMENTS

| | | | |
|---|---|---|---|
| 4,722,878 A | 2/1988 | Watakabe et al. |
| 4,731,155 A | 3/1988 | Napoli et al. |
| 4,757,207 A | 7/1988 | Chappelow |
| 4,776,695 A | 10/1988 | van Pham et al. |
| 4,848,911 A | 7/1989 | Uchida et al. |
| 4,887,283 A | 12/1989 | Hosno |
| 4,929,083 A | 5/1990 | Brunner |
| 4,964,145 A | 10/1990 | Maldonado |
| 5,028,366 A | 7/1991 | Harakal et al. |
| 5,072,126 A | 12/1991 | Progler |
| 5,074,667 A | 12/1991 | Miyatake |
| 5,148,036 A | 9/1992 | Matsugu et al. |
| 5,148,037 A | 9/1992 | Suda et al. |
| 5,151,754 A | 9/1992 | Ishibashi et al. |
| 5,155,749 A | 10/1992 | DiMilia et al. |
| 5,160,402 A | 11/1992 | Cheng |
| 5,171,490 A | 12/1992 | Fudim |
| 5,179,863 A | 1/1993 | Uchida et al. |
| 5,204,739 A | 4/1993 | Domenicali |
| 5,218,193 A | 6/1993 | Miyatake |
| 5,235,400 A | 8/1993 | Terasawa et al. |
| 5,259,926 A | 11/1993 | Kuwabara et al. |
| 5,270,222 A | 12/1993 | Moslehi |
| 5,331,371 A | 7/1994 | Mori et al. |
| 5,331,407 A | 7/1994 | Doi et al. |
| 5,335,066 A | 8/1994 | Yamada et al. |
| 5,355,219 A | 10/1994 | Araki et al. |
| 5,386,119 A | 1/1995 | Ledger |
| 5,403,433 A | 4/1995 | Morrison et al. |
| 5,414,514 A | 5/1995 | Smith et al. |
| 5,425,548 A | 6/1995 | Haisma et al. |
| 5,452,090 A | 9/1995 | Progler et al. |
| 5,477,058 A | 12/1995 | Sato |
| 5,493,401 A | 2/1996 | Horie et al. |
| 5,504,793 A | 4/1996 | Chen |
| 5,508,527 A | 4/1996 | Kuroda et al. |
| 5,512,131 A | 4/1996 | Kumar et al. |
| 5,545,367 A | 8/1996 | Bae et al. |
| 5,563,684 A | 10/1996 | Stagaman |
| 5,563,702 A | 10/1996 | Emery et al. |
| 5,565,114 A | 10/1996 | Saito et al. |
| 5,601,641 A | 2/1997 | Stephens |
| 5,625,193 A | 4/1997 | Broude et al. |
| 5,633,505 A | 5/1997 | Chung et al. |
| 5,669,303 A | 9/1997 | Maracas et al. |
| 5,686,993 A | 11/1997 | Kokubo et al. |
| 5,694,207 A | 12/1997 | Hung et al. |
| 5,719,495 A | 2/1998 | Moslehi |
| 5,724,145 A | 3/1998 | Kondo et al. |
| 5,726,548 A | 3/1998 | Chiba et al. |
| 5,737,064 A | 4/1998 | Inoue et al. |
| 5,772,905 A | 6/1998 | Chou |
| 5,774,574 A | 6/1998 | Hoki |
| 5,776,748 A | 7/1998 | Singhvi et al. |
| 5,785,918 A | 7/1998 | Hull |
| 5,802,914 A | 9/1998 | Fassler et al. |
| 5,808,742 A | 9/1998 | Everett et al. |
| 5,820,769 A | 10/1998 | Chou |
| 5,837,892 A | 11/1998 | Cavallaro et al. |
| 5,849,209 A | 12/1998 | Kindt-Larsen et al. |
| 5,849,222 A | 12/1998 | Jen et al. |
| 5,876,550 A | 3/1999 | Feygin et al. |
| 5,877,032 A | 3/1999 | Guinn et al. |
| 5,877,036 A | 3/1999 | Kawai |
| 5,877,861 A | 3/1999 | Ausschnitt et al. |
| 5,885,472 A | 3/1999 | Miyazaki et al. |
| 5,948,470 A | 9/1999 | Harrison et al. |
| 5,956,216 A | 9/1999 | Chou |
| 5,999,245 A | 12/1999 | Suzuki |
| 6,016,696 A | 1/2000 | Bair et al. |
| 6,019,166 A | 2/2000 | Viswanath et al. |
| 6,038,280 A | 3/2000 | Rossiger et al. |
| 6,049,373 A | 4/2000 | Miyatake |
| 6,052,183 A | 4/2000 | Lee |
| 6,068,783 A | 5/2000 | Szetsen |
| 6,081,334 A | 6/2000 | Grimbergen et al. |
| 6,088,103 A | 7/2000 | Everett et al. |
| 6,091,485 A | 7/2000 | Li et al. |
| 6,112,588 A | 9/2000 | Cavallaro et al. |
| 6,128,085 A | 10/2000 | Buermann et al. |
| 6,133,576 A | 10/2000 | Shafer et al. |
| 6,137,562 A | 10/2000 | Masuyuki et al. |
| 6,150,231 A | 11/2000 | Muller et al. |
| 6,153,886 A | 11/2000 | Hagiwara et al. |
| 6,204,895 B1 | 3/2001 | Nakamura et al. |
| 6,204,922 B1 | 3/2001 | Chalmers |
| 6,218,316 B1 | 4/2001 | Marsh |
| 6,245,581 B1 | 6/2001 | Bonser et al. |
| 6,278,519 B1 | 8/2001 | Rosencwaig et al. |
| 6,278,809 B1 | 8/2001 | Johnson et al. |
| 6,285,439 B1 | 9/2001 | Miyatake |
| 6,295,120 B1 | 9/2001 | Miyatake |
| 6,297,880 B1 | 10/2001 | Rosencwaig et al. |
| 6,304,326 B1 | 10/2001 | Aspnes et al. |
| 6,309,580 B1 | 10/2001 | Chou |
| 6,334,960 B1 | 1/2002 | Willson et al. |
| 6,355,198 B1 | 3/2002 | Kim et al. |
| 6,383,888 B1 | 5/2002 | Stirton |
| 6,387,787 B1 | 5/2002 | Mancini et al. |
| 6,388,755 B1 | 5/2002 | Zhao |
| 6,391,217 B2 | 5/2002 | Schaffer et al. |
| 6,420,892 B1 | 7/2002 | Krivy et al. |
| 6,482,742 B1 | 11/2002 | Chou |
| 6,489,068 B1 | 12/2002 | Kye |
| 6,517,977 B2 | 2/2003 | Resnick et al. |
| 6,517,995 B1 | 2/2003 | Jacobson et al. |
| 6,518,189 B1 | 2/2003 | Chou |
| 6,522,411 B1 | 2/2003 | Moon et al. |
| 6,561,706 B2 | 5/2003 | Singh et al. |
| 6,580,172 B2 | 6/2003 | Mancini et al. |
| 6,580,505 B1 | 6/2003 | Bareket |
| 6,603,538 B1 | 8/2003 | Oluseyi et al. |
| 6,630,410 B2 | 10/2003 | Trapp et al. |
| 6,633,391 B1 | 10/2003 | Oluseyi et al. |
| 6,636,311 B1 | 10/2003 | Ina et al. |
| 6,646,662 B1 | 11/2003 | Nebashi et al. |
| 6,665,119 B1 | 12/2003 | Kurtz et al. |
| 6,696,220 B2 | 2/2004 | Bailey et al. |
| 6,713,238 B1 | 3/2004 | Chou et al. |
| 6,746,319 B2 | 6/2004 | Tada et al. |
| 6,753,972 B1 | 6/2004 | Hirose et al. |
| 6,770,852 B1 | 8/2004 | Steger |
| 6,771,374 B1 | 8/2004 | Rangarajan et al. |
| 6,776,094 B1 | 8/2004 | Whitesides et al. |
| 6,791,669 B2 | 9/2004 | Poon |
| 6,809,356 B2 | 10/2004 | Chou |
| 6,819,426 B2 | 11/2004 | Sezginer et al. |
| 6,828,244 B2 | 12/2004 | Chou |
| 6,842,229 B2 | 1/2005 | Sreenivasan et al. |
| 6,849,558 B2 | 2/2005 | Schaper |
| 6,871,558 B2 | 3/2005 | Choi et al. |
| 6,873,087 B1 | 3/2005 | Choi et al. |
| 6,900,881 B2 | 5/2005 | Sreenivasan et al. |
| 6,902,853 B2 | 6/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,919,152 B2 | 7/2005 | Sreenivasan et al. |
| 6,921,615 B2 | 7/2005 | Sreenivasan et al. |
| 6,922,906 B2 | 8/2005 | Choi et al. |
| 6,929,762 B2 | 8/2005 | Rubin |
| 6,932,934 B2 | 8/2005 | Choi et al. |
| 6,954,275 B2 | 10/2005 | Choi et al. |
| 6,986,975 B2 | 1/2006 | Sreenivasan et al. |

| | | | |
|---|---|---|---|
| 7,027,156 B2 | 4/2006 | Watts et al. | |
| 7,070,405 B2 | 7/2006 | Sreenivasan et al. | |
| 7,119,886 B2 | 10/2006 | Leenders et al. | |
| 7,136,150 B2 | 11/2006 | Sreenivasan et al. | |
| 7,170,589 B2 | 1/2007 | Cherala et al. | |
| 7,186,483 B2 | 3/2007 | Sreenivasan et al. | |
| 7,281,921 B2 | 10/2007 | Watts et al. | |
| 7,292,326 B2 | 11/2007 | Nimmakayala et al. | |
| 7,303,383 B1 | 12/2007 | Sreenivasan et al. | |
| 7,323,130 B2 | 1/2008 | Nimmakayala et al. | |
| 7,630,067 B2 * | 12/2009 | Nimmakayala et al. | 356/139.04 |
| 2001/0023042 A1 | 9/2001 | Dirksen et al. | |
| 2002/0018190 A1 | 2/2002 | Nogawa et al. | |
| 2002/0042027 A1 | 4/2002 | Chou et al. | |
| 2002/0069525 A1 | 6/2002 | Hada et al. | |
| 2002/0132482 A1 | 9/2002 | Chou | |
| 2002/0150398 A1 | 10/2002 | Choi et al. | |
| 2002/0167117 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0081193 A1 | 5/2003 | White et al. | |
| 2003/0092261 A1 | 5/2003 | Kondo et al. | |
| 2003/0112421 A1 | 6/2003 | Smith | |
| 2003/0133126 A1 | 7/2003 | Sarfaty et al. | |
| 2003/0179354 A1 | 9/2003 | Araki et al. | |
| 2003/0180631 A1 | 9/2003 | Shiota et al. | |
| 2004/0032581 A1 | 2/2004 | Nikoonahad et al. | |
| 2004/0033515 A1 | 2/2004 | Cao et al. | |
| 2004/0036201 A1 | 2/2004 | Chou et al. | |
| 2004/0046288 A1 | 3/2004 | Chou | |
| 2004/0110856 A1 | 6/2004 | Young et al. | |
| 2004/0118809 A1 | 6/2004 | Chou et al. | |
| 2004/0131718 A1 | 7/2004 | Chou et al. | |
| 2004/0137734 A1 | 7/2004 | Chou et al. | |
| 2004/0149687 A1 | 8/2004 | Choi et al. | |
| 2004/0156108 A1 | 8/2004 | Chou et al. | |
| 2004/0163563 A1 | 8/2004 | Sreenivasan et al. | |
| 2004/0192041 A1 | 9/2004 | Jeong et al. | |
| 2004/0197843 A1 | 10/2004 | Chou et al. | |
| 2004/0207836 A1 | 10/2004 | Chhibber | |
| 2004/0250945 A1 | 12/2004 | Zheng et al. | |
| 2004/0257571 A1 | 12/2004 | Mieher et al. | |
| 2005/0037143 A1 | 2/2005 | Chou et al. | |
| 2005/0051742 A1 | 3/2005 | Shiraishi | |
| 2005/0064344 A1 | 3/2005 | Bailey et al. | |
| 2005/0269745 A1 | 12/2005 | Cherala et al. | |
| 2005/0270516 A1 | 12/2005 | Cherala et al. | |
| 2005/0271955 A1 | 12/2005 | Cherala et al. | |
| 2006/0019183 A1 | 1/2006 | Voisin | |
| 2006/0114450 A1 | 6/2006 | Nimmakayala et al. | |
| 2006/0115999 A1 | 6/2006 | Sreenivasan et al. | |
| 2007/0228609 A1 | 10/2007 | Sreenivasan et al. | |
| 2007/0228610 A1 | 10/2007 | Sreenivasan et al. | |
| 2007/0243655 A1 | 10/2007 | Schmid et al. | |
| 2008/0153312 A1 | 6/2008 | Sreenivasan et al. | |
| 2009/0026657 A1 | 1/2009 | Nimmakayala et al. | |

FOREIGN PATENT DOCUMENTS

| | | |
|---|---|---|
| JP | 57-7931 | 1/1982 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |
| WO | WO/2004/076963 | 9/2004 |

OTHER PUBLICATIONS

Williams et al., Six Degree of Freedom Mag-Lev Stage Development, SPIE vol. 3051, 856-867 Jan. 1, 1997.
Wang et al., Passive Compliance versus Active Compliance in Robot-Based Automated Assembly Systems, Industrial Robot vol. 25, No. 1, pp. 48-57 Jan. 1, 1998.
Rong et al., Design and Analysis of Flexure-Hinge Mechanism Used in Micro-Positioning Stages, ASME vol. 2, pp. 979-985 Jan. 1, 1994.
Feynman, There's Plenty of Room at the Bottom, Dec. 1, 1959.
Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Mansky et al., Large-Area Domain Alignment in Block Copolymer Thin Films Using Electric Fields, Macromolecules. vol. 31. No. 13, pp. 4399-4401 Jun. 9, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Chou et al., Imprint of Sub-25 nm Vias and Trenches in Polymers, Appl. Phys. Lett. 67 (21) Nov. 20, 1995.
Martin et al., Predication of Fabrication Distortions in Step and Flash Imprint Lithography Templates, Journal of Vacuum Science Technology B 20(6), pp. 2891-2895 Nov. 1, 2002.
White et al., Novel Alignment System for Imprint Lithography, J. Vac. Sci. Technol. B 18(6), pp. 3552-3556 Nov. 1, 2000.
Nguyen, Asymmetric Fluid-Structure Dynamics in Nanoscale Imprint Lithography, The University of Texas at Austin, pp. 1-111 Aug. 1, 2001.
Uchida et al., A Mask-to-Wafer Alignment and Gap Setting Method for X-ray Lithography Using Gratings, J. Vac. Sci. Technol. B 9 (6), pp, 3202-3206 Nov. 1, 1991.
Colburn et al., Step and Flash Imprint Lithography for sub-100 nm Patterning, Proceedings of SPIE vol. 3997, pp. 453-457 Jan. 1, 2000.
Mitsui et al., Application of Two-Wavelength Optical Heterodyne Alignment System in XS-1, Part of the SPIE Conference on Emerging Lithographic Technologies III, SPIE vol. 3676, pp. 455-464 Mar. 1, 1999.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol, B 18(6), pp. 3557-3560 Nov. 1, 2000.
Abstract of Japanese Patent 57-7931, Apr. 14, 2004.
Abstract of Japanese Patent 63-138730, Apr. 14, 2004.
Abstract of Japanese Patent 55-88332, Apr. 14, 2004.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Office Action from U.S. Appl. No. 10/053,357, Dec. 16, 2003.
Chou et al., Ultrafast and Direct Imprint of Nanostructures in Silicon, Nature, col. 417, (Jun. 2002), pp. 835-837 Jun. 1, 2002.
Armitage et al., Analysis of Overlay Distortion Patterns, SPIE vol. 921 Integrated Circuit Metrology, Inspection, and Process Control II (1988) Jan. 1, 1988.

Moon et al., Interferometric-Spatial-Phase Imaging for Six-Axis Mask Control, MIT NanoStructures Laboratory, Research Laboraty of Electronics Oct. 17, 2003.

Chen et al., Adaptive Alignment of Photomasks for Overlay Placement, Journal of Vacuum Science. B 20(6), pp. 3099-3105 Nov. 1, 2002.

Schneider et al., The Wave-Printer: Towards Large-Area, Multilayer Microcontact-Printing, Proc. Of 4th euspen International Conference, Glasgos, Scotland (UK) May 1, 2004.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Bailey et al., Step and Flash Imprint Lithography: Defect Analysis, Journal of Vacuum Science. B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Park et al., Aligning Liquid Crystals Using Replicated Nanopatterns, PSI Scientific Report 2002, vol. VII, p. 85 Mar. 1, 2003.

Deng et al., Simulation of Exposure and Alignment for Nano-imprint Lithography, Proc. SPIE, vol. 4688-93, p. 842-849 Jan. 1, 2002.

Deng et al., Rigorous Electromagnetic Simulation Applied to Alignment Systems, Proc. SPIE, vol. 4346-164, p. 1533-1540 Jan. 1, 2001.

Myron et al., Advanced Mask Metrology Enabling Characterization of Imprint Lithography Templates, SPIE Microlithography Conference Feb. 1, 2005.

Choi et al., Distortion and Overlay Performance of UV Step and Repeat Imprint Lithography, MNE Micro- and Nano-Engineering Conference Sep. 1, 2004.

Nordquist et al., Image Placement Issues for ITO-based Step and Flash Imprint Lithography Templates, J. Vac. Sci. Technol. B, pp. 695-701 Mar. 1, 2004.

Gehoski et al., Evaluation of the Imprio 100 Step and Flash Imprint Lithography Tool, Proceedings of SPIE, vol. 5374, pp. 1006-1016 May 1, 2004.

Dauksher et al., Step and Flash Imprint Lithography Template Characterization, from an Etch Perspective, J. Vac. Sci. Technol. B 21(6), pp. 2771-2776 Nov. 1, 2003.

Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.

Hess et al., Inspection of Templates for Imprint Lithography, J. Vac. Sci. Technol. B 22(6) Nov. 1, 2004.

* cited by examiner

INTERFEROMETRIC ANALYSIS METHOD FOR THE MANUFACTURE OF NANO-SCALE DEVICES

CROSS REFERENCE TO RELATED APPLICATION

This application is a Continuation of U.S. patent application Ser. No. 11/000,321 filed on Nov. 30, 2004, which is a Divisional of U.S. patent application Ser. No. 11/000,331 on Nov. 30, 2004; both of which are hereby incorporated by reference.

STATEMENT REGARDING FEDERALLY SPONSORED RESEARCH OR DEVELOPMENT

The United States government has a paid-up license in this invention and the right in limited circumstance to require the patent owner to license other on reasonable terms as provided by the terms of N66001-01-1-8964 and N66001-02-C-8011 awarded by the Defense Advanced Research Projects Agency (DARPA).

BACKGROUND OF THE INVENTION

The field of the invention relates generally to nano-fabrication of structures. More particularly, the present invention is directed to a system that facilitates analysis of multiple patterns in superimposition suited for the manufacture of nano-scale devices.

Nano-scale fabrication involves the fabrication of very small structures, e.g., having features on the order of one nano-meter or more. A promising process for use in nano-scale fabrication is known as imprint lithography. Exemplary imprint lithography processes are described in detail in numerous publications, such as U.S. Patent Publication No. 2004-0065976 entitled "Method and a Mold to Arrange Features on a Substrate to Replicate Features having Minimal Dimensional Variability;" U.S. Patent Publication No. 2004-0065252 entitled "Method of Forming a Layer on a Substrate to Facilitate Fabrication of Metrology Standards;" and U.S. Pat. No. 6,936,194 entitled "Method and a Mold to Arrange Features on a Substrate to Replicate Features having Minimal Dimensions Variability;" all of which are assigned to the assignee of the present invention and are incorporated herein by reference.

Referring to FIG. 1, the basic concept behind imprint lithography is forming a relief pattern on a substrate that may function as, inter alia, an etching mask so that a pattern maybe formed into the substrate that corresponds to the relief pattern. A system employed to form the relief pattern includes a stage 10 upon which a substrate 12 is supported. A template 14, having a mold 16 with a patterning surface 18 thereon. Patterning surface 18 may be substantially smooth and/or planar or may be patterned so that one or more recesses are formed therein. Template 14 is coupled to an imprint head 20 to facilitate movement of template 14. A fluid dispense system 22 is coupled to be selectively placed in fluid communication with substrate 12 so as to deposit polymeric material 24 thereon. A source 26 of energy 28 is coupled to direct energy 28 along a path 30. Imprint head 20 and stage 10 are configured to arrange mold 16 and substrate 12, respectively, to be in superimposition and is disposed in path 30. Either imprint head 20, stage 10 or both vary a distance between mold 16 and substrate 12 to define a desired volume therebetween that is filled by polymeric material 24. Typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, which causes polymeric material 24 to solidify and/or cross-link conforming to the shape of the substrate surface 24 and mold surface 18. Control of this process is regulated by processor 32 that is in data communication with stage 10 imprint head 20, fluid dispense system 22, source 26, operating on a computer readable program stored in memory 34.

To allow energy 28 to impinge upon polymeric material 24, it is desired that mold 16 be substantially transparent to the wavelength of energy 28 so that the same may propagate therethrough. Additionally, to maximize a flux of energy propagating through mold 16, energy has a sufficient cross-section to cover the entire area of mold 16 with no obstructions being present in path 30.

Referring to FIGS. 1 and 2 often a pattern generated by mold 16 is disposed upon a substrate 112 in which a preexisting pattern in present. To that end, a primer layer 36 is typically deposited upon patterned features, shown as recesses 38 and protrusions 40, formed into substrate 112 to provide a smooth, if not planar, surface 42 upon which to form a patterned imprint layer (not shown) from polymeric material 24 disposed upon surface 42. To that end, mold 16 and substrate 112 include alignment marks, which may include sub-portions of the patterned features. For example, mold 16 may have alignment marks, referred to as mold alignment marks, which are defined, by features 44 and 46. Substrate 112 may include alignment marks, referred to as substrate alignment marks, which are defined by features 48 and 50.

Not obtaining proper alignment between mold 16 and substrate 112 can introduce errors in that pattern recorded on substrate 112. In addition, to standard alignment errors, magnification/run out errors can creates distortions in the recorded pattern due, inter alia, to extenuative variations between mold 16 and region of substrate 112 to be patterned. The magnification/run-out errors occur when a region of substrate 112 in which the pattern on mold 16 is to be recorded exceeds the area of the pattern on mold 16. Additionally, magnification/run-out errors occur when the region of substrate 112 in which the pattern of mold 16 is to be recorded has an area smaller than the original pattern. The deleterious effects of magnification/run-out errors are exacerbated when forming multiple patterns in a common region. Additional errors may occur were the pattern on mold 16 rotated, along an axis normal to substrate 112, with respect to the region on substrate 112 in which the pattern on mold 16 is to be recorded. This is referred to as orientation error. Additionally, when the shape of the periphery of mold 16 differs from the shape of the perimeter of the region on substrate 112 on which the pattern is to be recorded also causes distortion. This typically occurs when transversely extending perimeter segments of either mold 16 and/or region of substrate 112 are not orthogonal. This is referred to as skew/orthogonality distortions.

To ensure proper alignment between the pattern on substrate 112 with the pattern generated by mold 16 it is desired to ensure proper alignment between the mold and substrate alignment marks. This has typically been achieved employing the aided eye, e.g., an alignment system 53 selectively placed in optical communication with both mold 16 and substrate 12, concurrently. Exemplary alignment systems have included ocular microscopes or other imaging systems. Alignment system 53 typically obtains information parallel to path 30. Alignment is then achieved manually by an operator or automatically using a vision system.

A need exists, therefore, to provide improved alignment techniques for imprint lithographic processes.

SUMMARY OF THE INVENTION

The present invention features a method to determine relative spatial parameters between two coordinate systems, which may be a mold and a region of a substrate in which mold is employed to generate a pattern. The method includes sensing relative alignment between the two coordinate systems at multiple points and determines relative spatial parameters therebetween. The relative spatial parameters include a relative area and a relative shape. These and other embodiments are discussed more fully below.

DETAILED DESCRIPTION OF THE INVENTION

Figure 1:
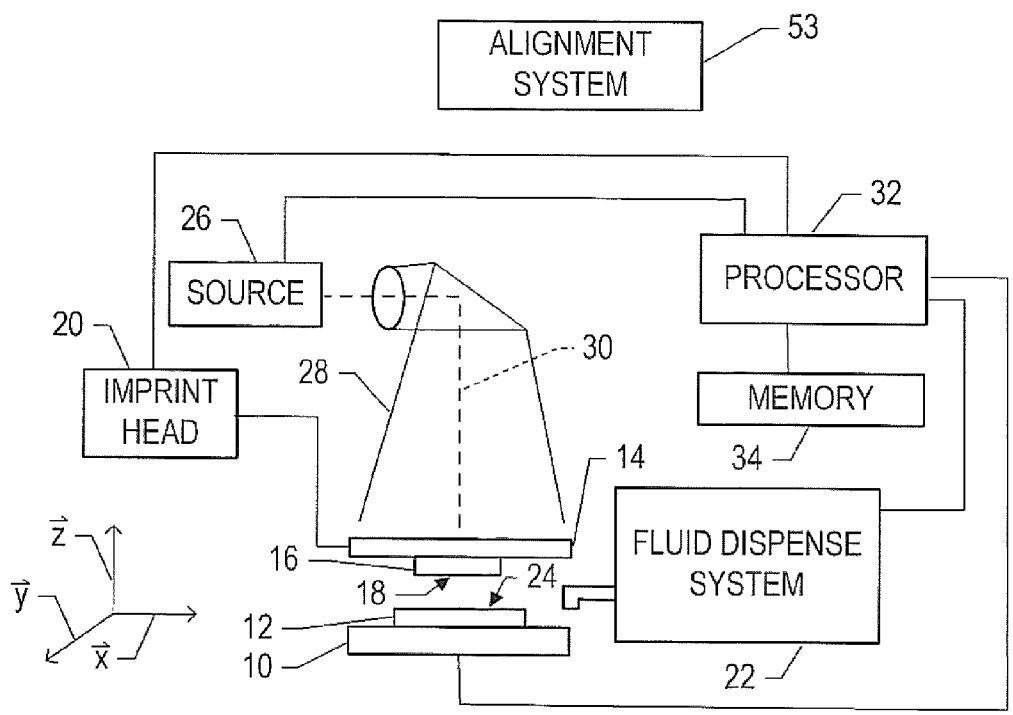
FIG. 1 is a simplified plan view of an imprint lithography system in accordance with the prior art.
Figure 2:
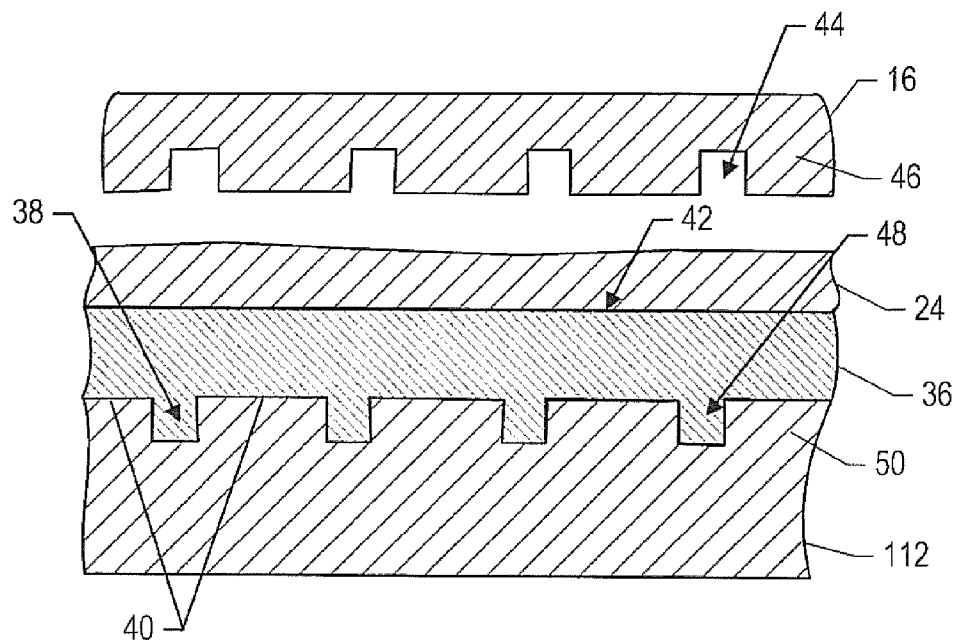
FIG. 2 is a cross-sectional view of a patterned substrate having a plurality of layers disposed thereon with a mold in superimposition therewith in accordance with the prior art.
Figure 3:
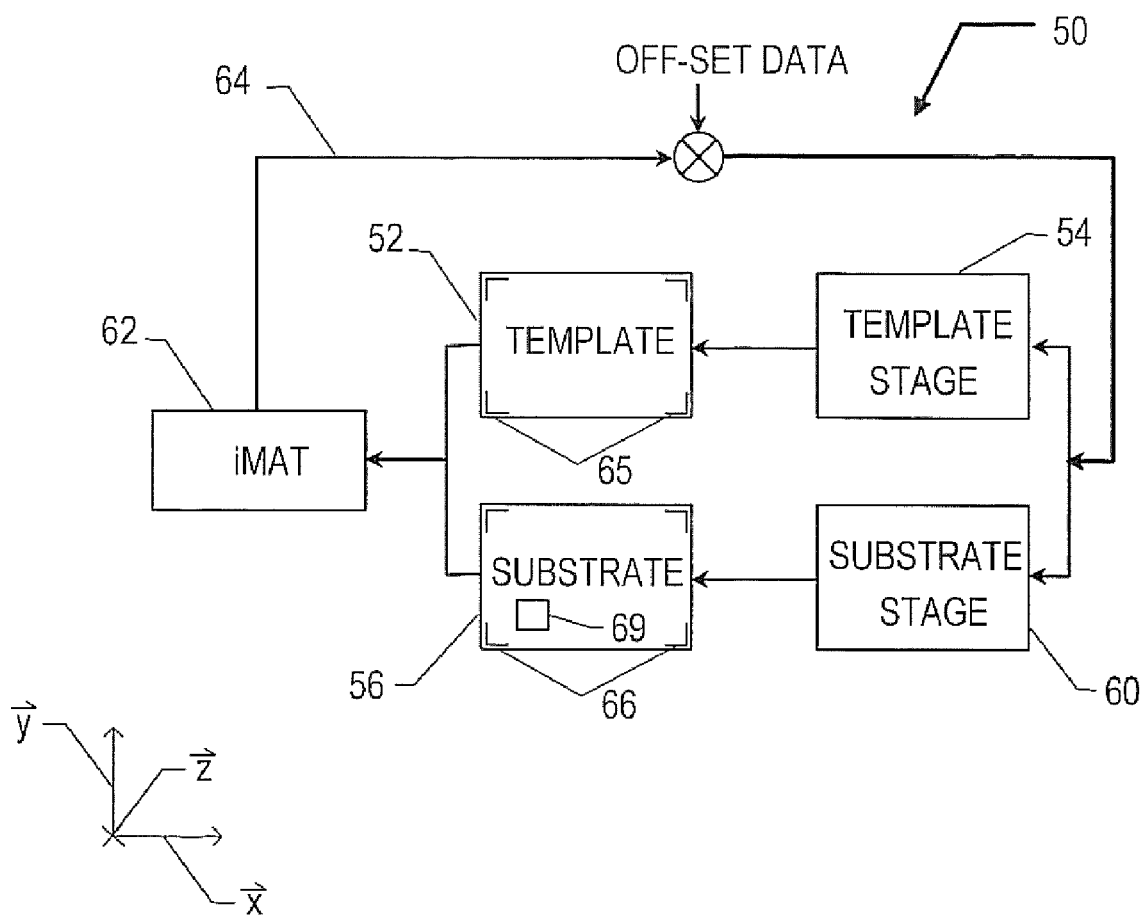
FIG. 3 is a block diagram showing an imprint lithography system in accordance with the present invention.

Referring to FIG. 3, the present invention includes an imprint lithography system 50 that has a template 52, retained within a template stage 54, a substrate 56 supported upon a substrate stage 60 and an interferometric analysis tool (iMAT™) 62 is in optical communication with both template 52 and substrate 56. Also are a polymeric fluid dispensing system and a source of actinic radiation, both of which are typically included in imprint lithography systems, as discussed with respect to FIG. 1, but are not shown for clarity. An exemplary template stage includes a chucking system (not shown) and an actuator sub-assembly (not shown) coupled to imprint head 20 through a flexure system (not shown), all of which are described in U.S. Patent Publication No. 2005-0270516, which is incorporated by reference herein.

iMAT™ 62 is coupled with both stages 54 and 60 to communicate therewith over feedback loop 64 to facilitate proper spatial arrangement between two coordinate systems, one defined by template 52 and one defined by substrate 56 to obtain a desired spatial arrangement therebetween. To that end, iMAT™ 62 produces data concerning multiple spatial parameters of both template 52 and substrate 56 and determines signals in response thereto to ensure differences between the spatial parameters are within desired tolerances. To that end, iMAT™ 62 is coupled to sense one or more of alignment marks on template 52, referred to as template alignment marks 65, as well as one or more of the alignment marks on substrate 56, referred to as substrate alignment marks 66. iMAT™ 62 can determine multiple relative spatial parameters of template 52 and substrate 56 based upon information obtained from sensing alignment marks 65 and 66. The spatial parameters includes misalignment therebetween, along X and Y directions, as well as relative size difference between substrate 56 and template 52 in the X and Y directions, referred to as a relative magnification/run out measurement, and relative non-orthogonality of two adjacent transversely extending edges on either template 52 and/or substrate 56, referred to as a skew measurement. Additionally, iMAT™ 62 can determine relative rotational orientation about the Z direction, which is substantially normal to a plane in which template 52 lies and a surface of substrate 56 facing template 52.

Figure 4:
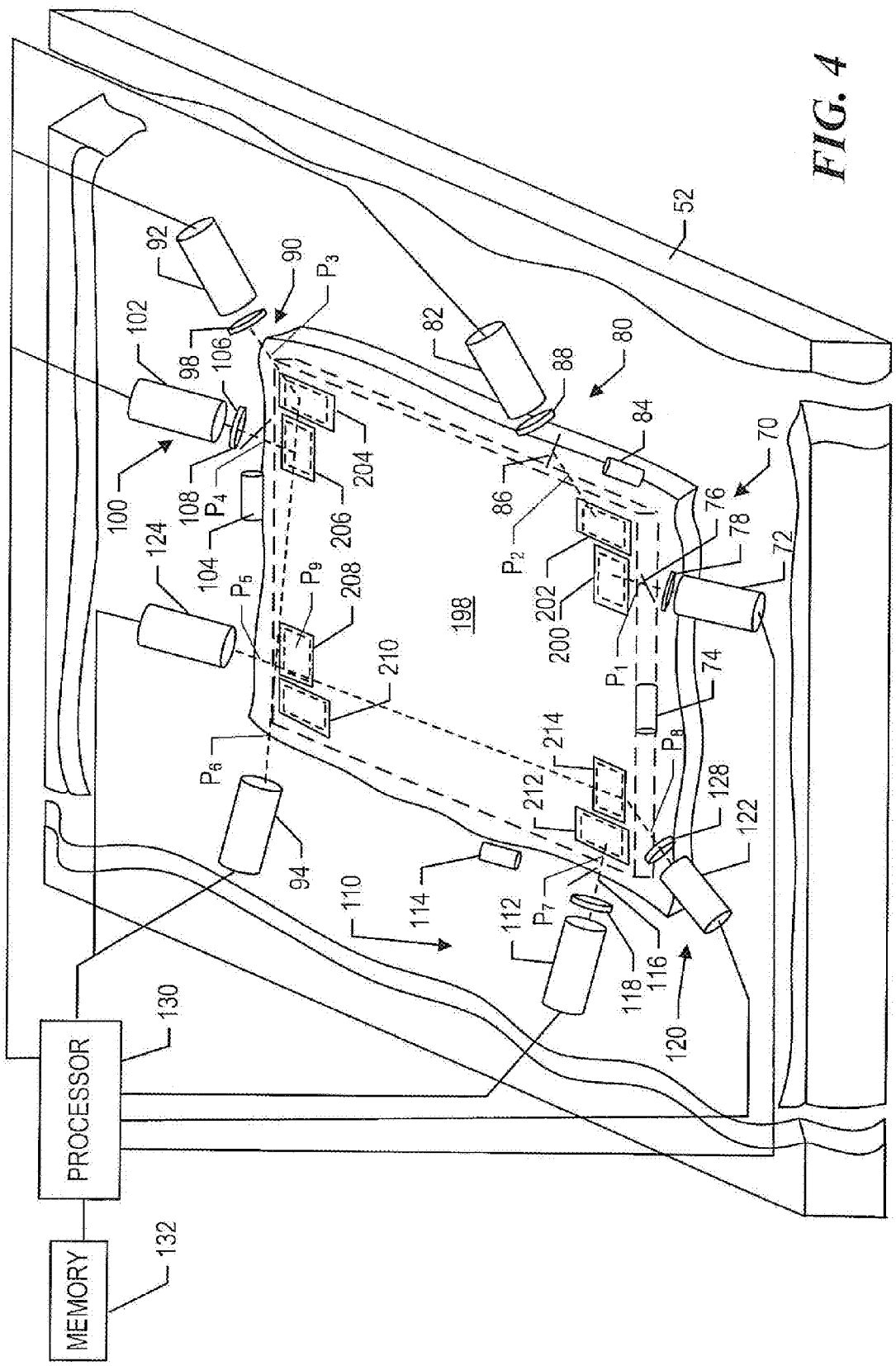
FIG. 4 is a partial perspective view and partial block diagram showing the components of an interferometric analysis tool shown in FIG. 3 in accordance with the present invention, with a template being shown from a top down perspective view.

Referring to FIG. 4, iMAT™ 62 includes a plurality of detection systems, shown as 70, 80, 90, 100, 110 and 120, as well as two illumination sources 94 and 124. Each of detection systems 70, 80, 90, 100, 110 and 120 includes a detector, 72, 82, 92, 102, 112 and 122 respectively. Each of detection systems 70, 80, 100 and 110 includes a source of illumination, shown as 74, 84, 104, and 114, respectively. Each of illumination sources 74, 84, 94, 104, 114 and 124 is coupled to impinge energy, such as light, upon a region of template 52 with which detectors 72, 82, 92, 102, 112 and 122, respectively, are in optical communication, i.e., lying within the field of view. Specifically, detector 72 is in optical communication with a region 200 of template 52 that comprises alignment marks disposed on a mold 198 through focusing optics 78 and a half-silvered (50/50) mirror 76.

Illumination source 74 produces optical energy that impinges upon half-silvered (50/50) mirror 76 that is then directed along a path $p_1$ to illuminate region 200. A portion of the optical energy impinging upon region 200 returns along path $p_1$, passing through half silvered mirror 76 and focused onto detector 72 by focusing optics 78. In a similar fashion, detector 82 is placed in optical communication with region 202 with half-silvered (50/50) mirror 86 and focusing optics 88 to sense optical energy, produced by illumination source 84, returning along path $p_2$. Detector 102 is placed in optical communication with region 206 with half-silvered (50/50) mirror 106 and focusing optics 108 to sense optical energy, produced by illumination source 104, returning along path $p_4$. Detector 112 is placed in optical communication with region 212 with half-silvered (50/50) mirror 116 and focusing optics 118 to sense optical energy, produced by illumination source 114, returning along path $p_7$. In this fashion, detection systems 70, 80, 100 and 110 employ co-axial illumination and detection. Exemplary systems for use a detectors 72, 82, 102 and 112 are available from Sony, Inc. under model numbers XEES50, XEHR58 and XE75.

To ensure that the entire area of mold 198 is exposed to allow actinic radiation to propagate therethrough, none of detectors 72, 82, 92, 102, 112 and 122; illuminations sources 74, 84, 94, 104, 114 and 124; and other components of the optical train are in superimposition therewith. To that end, each of paths $P_1$-$P_8$ forms an angle with respect to a normal to mold 198 in a range of 2° to 15°. With this configuration each of detectors 72, 82, 92, 102, 112 and 122 are arranged to sense desired wavelengths of radiation propagating from regions 200, 202, 204, 206, 212 and 214, respectively, while rejecting substantially all other wavelengths of other orders. For example, each of detectors 72, 82, 92, 102, 112 and 122 are arranged to sense one order (say first order, or higher orders, diffracted wavelengths of light from regions 200, 202, 204, 206, 212 and 214, respectively, while rejecting substantially all other wavelengths of other orders.

Detection systems 90 and 120, however, do not employ co-axial illumination and detection. Rather, illumination sources for detections systems 90 and 120 are disposed opposite detectors. For example, illumination source 94 directs energy along path $p_6$ to impinge upon region 204. A portion of the energy returning from region 204 propagates along path $p_3$ and is collected by optical train 98, which focuses the same on detector 92. In a similar fashion, illumination source 124 directs energy along path $p_5$ to impinge upon region 214, with a portion of the energy returning therefrom propagating along path $p_8$. The energy propagating along path p8 is collected by optical train 128 that focuses the same on detector 122. These non-coaxial illumination units can be used to capture the images with a faster speed as compared to the other co-axial illumination units. By illuminating from the opposite direction, the beam does not pass through or reflect off of the 50/50 mirror. Therefore, a higher energy of illumination can reach the detector. For the purpose of higher speed imaging, it is desired to maximize the beam intensity reaching the detector. Exemplary detection systems are available from Darsa Corporation of Waterloo, Canada as model numbers 1M150 and 1M75.

Although six detection systems are shown, 70, 80, 90, 100, 110 and 120 are shown, any number of detection systems may be present, dependent upon the spatial parameters of interested. For example, more than six detection systems may be employed so that two detection systems may be positioned to sense information from a common region among regions 200, 202, 204, 206, 208, 210, 212 and 214, resulting in eight, ten and twelve detection systems being present (not shown). It is also possible that each of detection systems 70, 80, 90, 100, 110 and 120 concurrently obtain information from more than one of regions 200, 202, 204, 206, 208, 210, 212 and 214. In this manner, a highly redundant set of data can be gathered by the detectors.

Each of detectors 72, 82, 92, 102, 112, 122 produces a signal, in response to the optical energy sensed, which is received by a processor 130 in data communication therewith. Processor 130 operates on a computer readable code stored in memory 132, in data communication therewith, to determine relative spatial parameters between two coordinate systems, such as mold 26 and a region 69 of substrate 56 in superimposition therewith in which patterning is to occur. The area of region 69 is typically coextensive with the area of mold 198.

Figure 5:
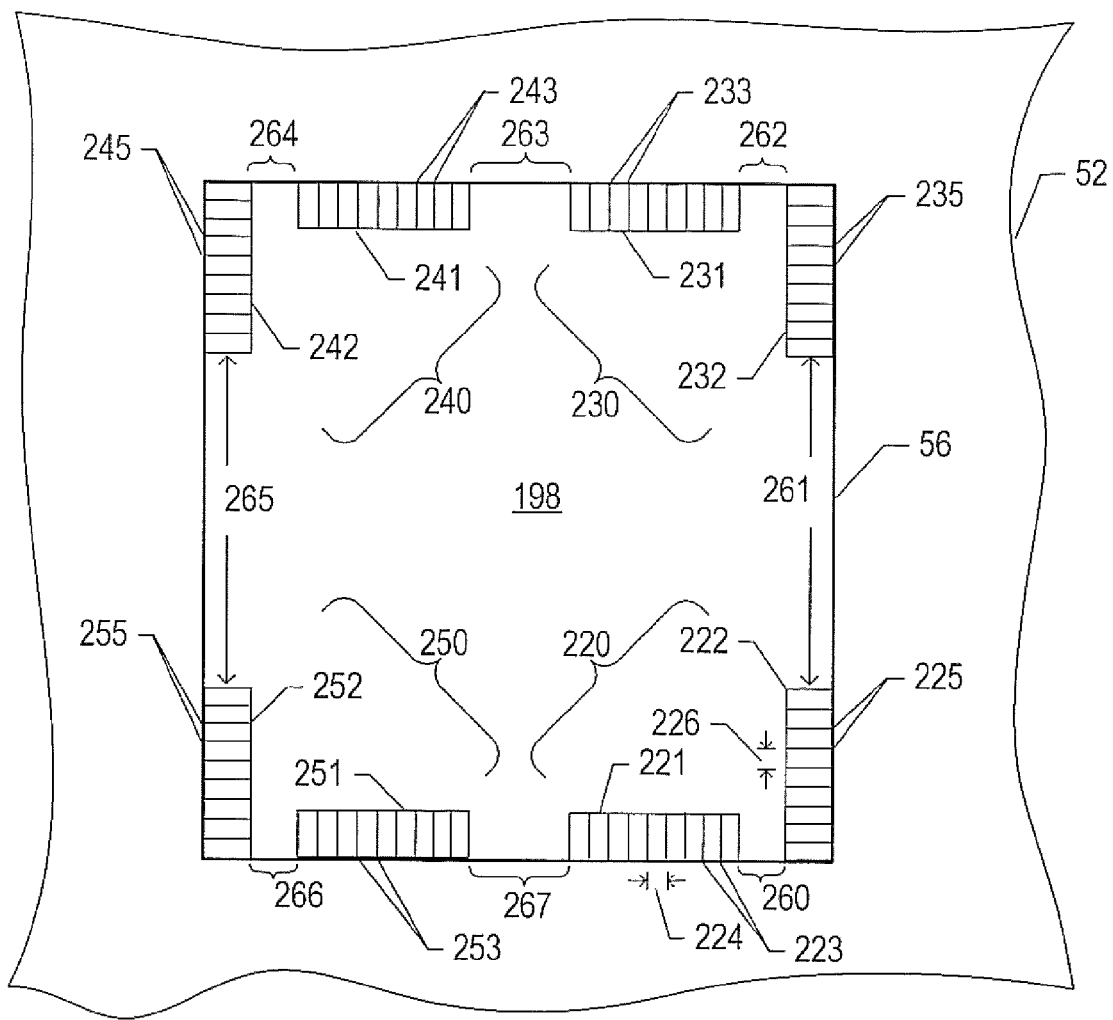
FIG. 5 is a plan view of the template shown in FIG. 4 in accordance with the present invention.

Referring to FIG. 5 disposed at each corner of mold 198 is a set of alignment marks, shown as 220, 230, 240 and 250. Each set of alignment marks includes an template alignment mark element (TAME) that consists of a plurality of parallel lines spaced apart along a direction, with the direction along which the plurality of lines associated with one of the TAMEs are spaced being orthogonal to the direction along which the plurality of lines are spaced that are associated with the remaining TAME. For example, set 220, includes TAMEs 221 and 222. TAME 221 includes a plurality of parallel lines 223 spaced-apart along the X direction, defining a pitch 224. TAME 222 includes a plurality of parallel lines 225 spaced-apart along the Y direction, defining a pitch 226. Similarly, lines 233 of TAME 231 are spaced-apart along the X direction as are lines 243 of TAME 241 and lines 253 of TAME 251. Lines 235 of TAME 232 are spaced apart along the Y direction, as are lines 245 of TAME 242 and lines 255 of TAME 252.

Referring to both FIGS. 4 and 5, each TAME 221, 222, 231, 232, 241, 242, 251 and 252 are uniquely associated with one of regions 200, 202, 204, 206, 208, 210, 212 and 214. Specifically, the spacing between adjacent alignment marks associated with one of the pairs of alignment mark pairs 220, 230, 240 and 250 is established so as to be absent from the region associated with the adjacent TAME. For example, the relative dimensions of each of TAMEs and regions are established so that the entire TAME is present with the region. As a result, TAME 221 is associated with region 200, TAME 222 is associated with region 202, TAMEs 232 and 231 are associated with regions 204 and 206, respectively. TAMEs 241 and 242 are associated with regions 208 and 210 respectively; and TAMEs 252 and 251 are associated with regions 212 and 214, respectively. Hiatuses 260 and 267, however, are established so that TAME 221 lays outside of both regions 214 and 202, and both TAMEs 251 and 222 lie outside of region 200. As a result, minimized is the amount of energy returning from outside of region 200, such as regions 202 and 214 and the distant regions 204, 206, 208, 210 and 212, that is sensed by detector 72. For the same reasons, hiatuses 261 and 262 are established so that TAME 232 lays outside of both regions 202 and 206, and both TAMEs 231 and 222 lie outside of region 204. Hiatuses 263 and 264 are established so that TAME 241 lays outside of both regions 206 and 210, and both TAMEs 231 and 242 lie outside of region 208. Hiatuses 265 and 266 are established so that TAME 252 lays outside of regions 210 and 214, and both TAMEs 242 and 251 lie outside of region 212.

Figure 6:
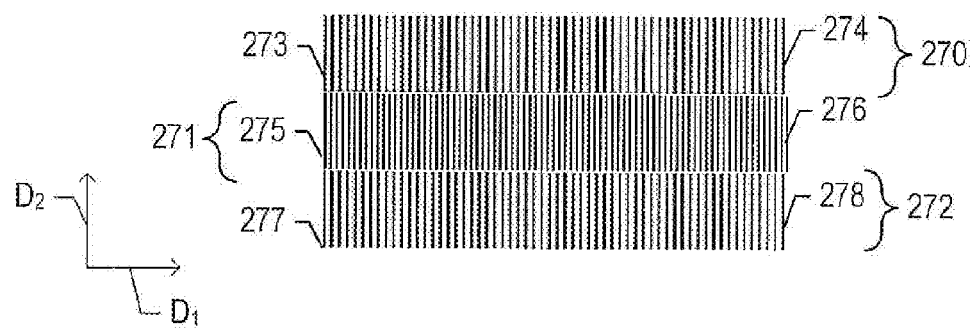
FIG. 6 is a plan view showing multiple series of features that may be included in alignment mark elements shown in FIG. 5.

Referring to both FIGS. 5 and 6, although each of TAMEs 221, 222, 231, 232, 241, 242, 251 and 252 comprise a single set of parallel lines, each may comprise of any number of sets of parallel lines, e.g., 1-n sets where n is an integer number. As a result one or more of TAMEs 221, 222, 231, 232, 241, 242, 251 and 252 may comprise of multiple sets of parallel lines. In the present embodiment, TAMEs 221, 222, 231, 232, 251 and 252 each includes three sets of parallel lines, shown as 270, 271 and 272 in abutting relationship so that the spacing therebetween in minimized. The spacing, or pitch, between adjacent pairs of parallel lines is substantially constant over the length of the sets 270, 272 and 274, with set 270 extending a length between opposed termini 273 and 274, set 271 extending a length between opposed termini 275 and 276; and set 272 extending a length between opposed termini 277 and 278. Although sets 270, 271 and 272 are shown extending coextensive with one another, this is not necessary.

Figure 7:
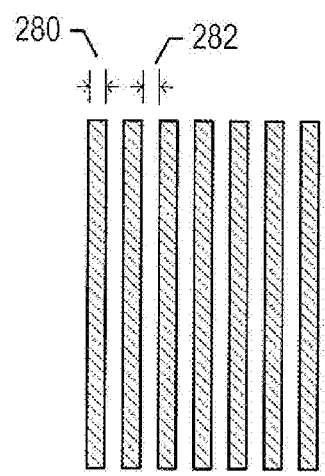
FIG. 7 is a detailed view of alignment mark features having a first pitch that may be associated with one or more of the series of features shown in FIG. 6.
Figure 8:
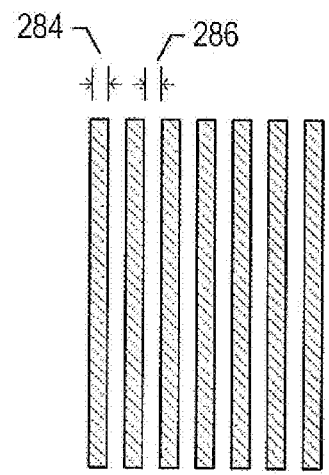
FIG. 8 is a detailed view of alignment mark features having a second pitch that may be associated with one or more of the series of features shown in FIG. 6.

Referring to FIGS. 6, 7 and 8, the pitch, measured along direction $D_1$, associated with one of sets 270, 271 and 272 differs from the pitch associated with the remaining sets 270, 271 and 272. In the present example, the pitch associated with sets 270 and 272 match, with the pitch associated with set 271 differing from the pitch associated with sets 270 and 272. For example, sets 270 and 272 each has 41 parallels lines with a width 280 approximately 1 micron wide, measured along direction $D_1$. Adjacent lines are separated by a hiatus 282 of approximately 1 micron, measured along direction $D_1$, resulting in sets 270 and 272 having 40 hiatuses providing a pitch of 2 microns. Set 271 has 39 parallels lines with a width 284 approximately 1.025 micron wide, measured along direction $D_1$. Adjacent lines are separated by a hiatus 286, measured along direction $D_1$, of approximately 1.025 micron, resulting in set 271 having 40 hiatuses providing a pitch of 2.05 microns. A length of lines, measured along direction $D_2$, is approximately 45 microns.

Figure 9:
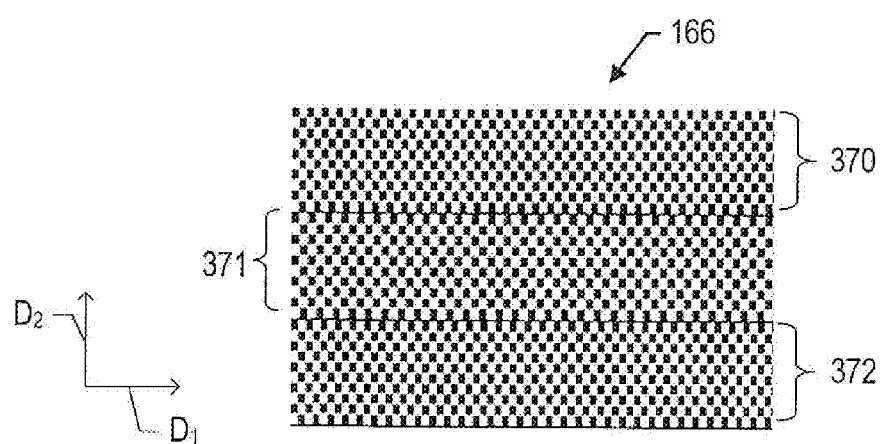
FIG. 9 is a plan view showing features that may be included in substrate alignment mark elements shown in FIG. 3.
Figure 10:
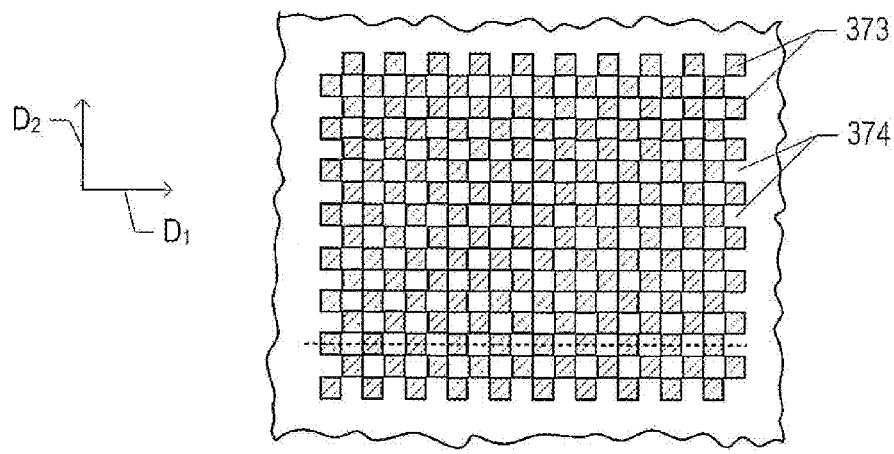
FIG. 10 is a detailed view of alignment mark features associated with one or more of the series of features shown in FIG. 9.

Referring to FIGS. 3, 6 and 9, to determine relative spatial parameters between mold 198 and region 69, alignment marks 66 includes a plurality of alignment mark elements, referred to substrate alignment mark elements (SAME) 166. At least one of SAMEs 166 are in superimposition with one of TAMEs 221, 222, 231, 232, 241, 242, 251 and 252 and extend substantially coextensive therewith. In the present embodiment each of the TAMEs, 221, 222, 231, 232, 241, 242, 251 and 252 are in superimposition with one of the plurality of SAMEs 166. Specifically, each TAMEs 221, 222, 231, 232, 241, 242, 251 and 252 in superimposition with one of the SAME 166, differs from the TAMEs 221, 222, 231, 232, 241, 242, 251 and 252 in superimposition with the remaining SAMEs 166.

Referring to FIGS. 4, 6, 9 and 10, an exemplary SAME 166 may comprise a single set of spaced-apart parallel lines, as discussed above with respect to TAMEs 221, 222, 231, 232, 241, 242, 251 and 252. It is desired, however, to collect first order diffraction wavelength at an angle oblique to the normal to mold 198, propagating along one of paths $P_1$-$P_4$ and $P_7$-$P_8$. To that end, a pattern is employed that is periodic in two orthogonal directions. Referred to as a checkerboard pattern. Moreover, it is desired to employ three sets of checkerboard patterns, shown as 370, 371 and 372. The three sets of checkerboard patterns 370, 371 and 372 are in abutting relationship so that the spacing therebetween in minimized. Each checkerboard pattern includes a plurality of features 373 each of which is in general rectangular in shape. Each pair of adjacent features is separated by a hiatus 374. The spacing, or pitch, between adjacent pairs of features 373, along direction $D_1$, in sets 370 and 372 is substantially identical to the pitch of set 271. The spacing, or pitch, between adjacent pairs of features 373, along direction $D_2$, in sets 371 is substantially identical to the pitch of sets 270 and 272.

To facilitate sensing of wavelengths propagating along a path that is angled obliquely with respect to zero order specularly reflected wavelengths, the oblique angle selected is dependent upon the geometry of SAME 166, as well as TAMEs 221, 222, 231, 232, 241, 242, 251 and 252 and the order of diffraction wavelengths sensed. For example, first order diffraction wavelengths at an oblique angle, e.g., in a range of 2° to 15° with respect to a normal to mold 198 in order to obtain information substantially independent of a distance between mold 198 and region 69. To that end, the pitch of pairs of adjacent features 373, measured along direction $D_2$, is approximately 2.2 microns. With this configuration, placement of one of TAMEs 221, 222, 231, 232, 241, 242, 251 and 252 in superimposition with substrate alignment mark 166 results in set 270 being in superimposition with set 370 and extending coextensive therewith; set 271 is in superimposition with set 371, extending coextensive; and set 272 is in superimposition with set 372, extending coextensive therewith. Typical dimensions for TAMEs and SAMEs may be as high as 400 microns along the direction $D_1$ and 150 to 250 microns along the direction $D_2$, i.e., each of the parallel lines are 150 to 250 microns in length. They may be significantly lower in dimension, for example 100 micron along $D_1$ direction and 40 micron in length. Alternatively, the dimension along $D_1$ may be higher (~1 mm) and $D_2$ may be lower (~40 microns).

Referring to FIGS. 4, 6, 9 and 11, upon being placed in superimposition with a SAME 166, the direction $D_1$ extends parallel to the X-direction for TAMEs 221, 231, 241 and 251, as well as the SAME 166 in superimposition therewith. The direction $D_1$ extends parallel to the Y-direction for TAMEs 222, 232, 242 and 252 and the SAME in superimposition therewith. In this manner, light impinging upon each TAME 221, 222, 231, 232, 241, 242, 251 diffracts causing the first order diffraction wavelengths to be sensed by one of detector 72, 82, 92, 102, 112 and 122 in optical communication therewith. For example light diffracted from TAME 221 is sensed by detector 72, light diffracted from TAME 222 is sensed by detector 82; light diffracted from TAME 232 is sensed by detector 92; light diffracted by TAME 231 is sensed by detector 102; light diffracted by TAME 251 is sensed by detector 122; and light diffracted by TAME 252 is sensed by detector 112. Typically, alignment occurs in the present of polymeric material that substantially fills the volume defined between mold 198 and region 69, referred to as in contact liquid align. To that end, it is desired that polymeric material not be disposed between and one of TAMEs 221, 222, 231, 232, 241, 242, 251 and the SAME 166 in superimposition therewith. To that end, it may be desired to employ as template 52, the template disclosed in U.S. patent application Ser. No. 10/917, 761, filed Aug. 13, 2004, Moat System For An Imprint Lithography Template, which is assigned to assignee of the present invention and is incorporated by reference herein.

Figure 11:
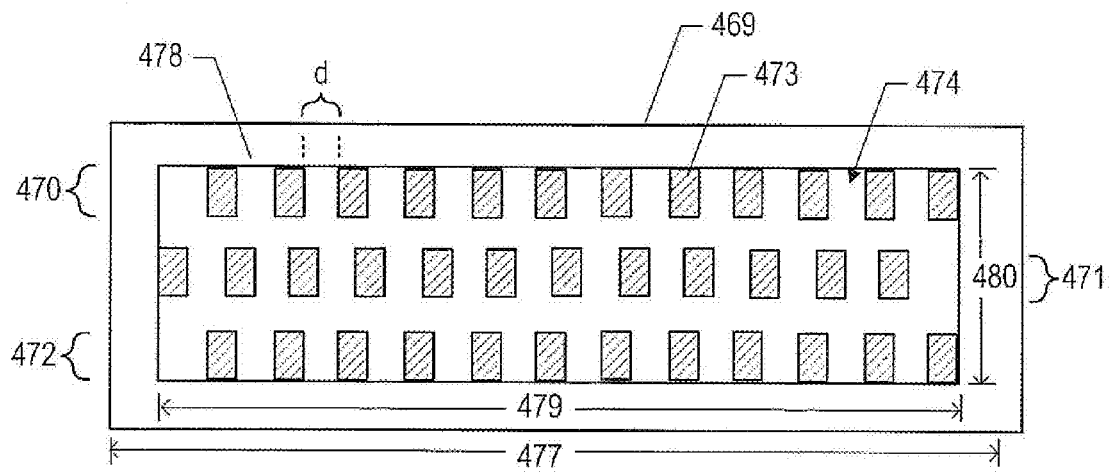
FIG. 11 is a plan view showing an image sensed by one or more of detectors shown in FIG. 4 when alignment marks features shown in FIGS. 6 and 9 are in superimposition and possess a non-zero offset.

Upon sensing the first order diffraction light, each of detectors 72, 82, 92, 102, 112 and 122 obtains an image 469, shown in FIG. 11, of three series of spatial varying light intensities 470, 471 and 472 in which a adjacent high intensity regions 473 are separated a distance, d, by a low intensity region 474. Series 470 corresponds to diffractive light generated by the superimposition of sets 270 and 370. Similarly series 471 corresponds to superimposition of sets 271 and 371, and series 472 corresponds to superimposition of sets 272 and 372. A desired spatial arrangement between region 69 and mold 198 is present upon high intensity regions 473 among series 470, 471 and 472 being positioned to generate a specific off-set corresponding to the template and substrate relative geometric information, which may be desired or may simply indicate misalignment.

Figure 12:
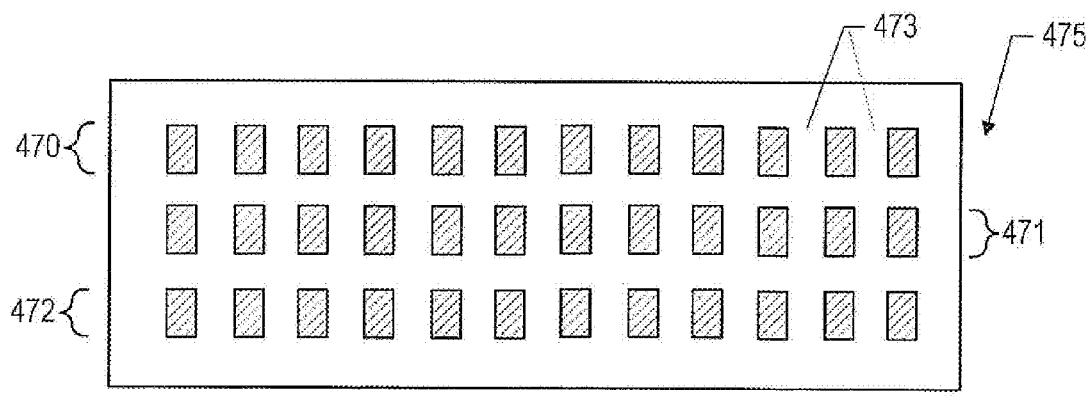
FIG. 12 is a plan view showing an image sensed by one or more of detectors shown in FIG. 4 when alignment marks features shown in FIGS. 6 and 9 are in superimposition and possess a zero offset.
Figure 13:
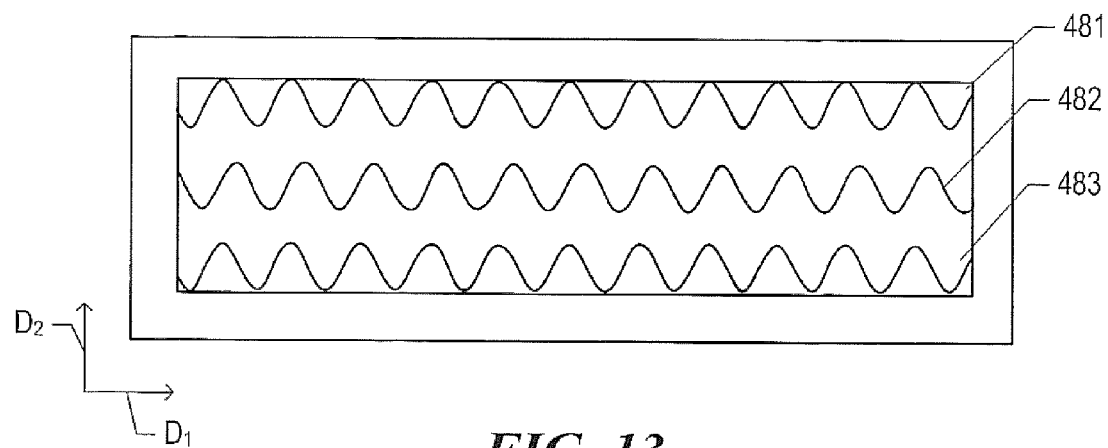
FIG. 13 is a graphical representation showing the intensity signal produced by one of the detectors shown in FIG. 4 in response to the image of FIG. 11.
Figure 14:
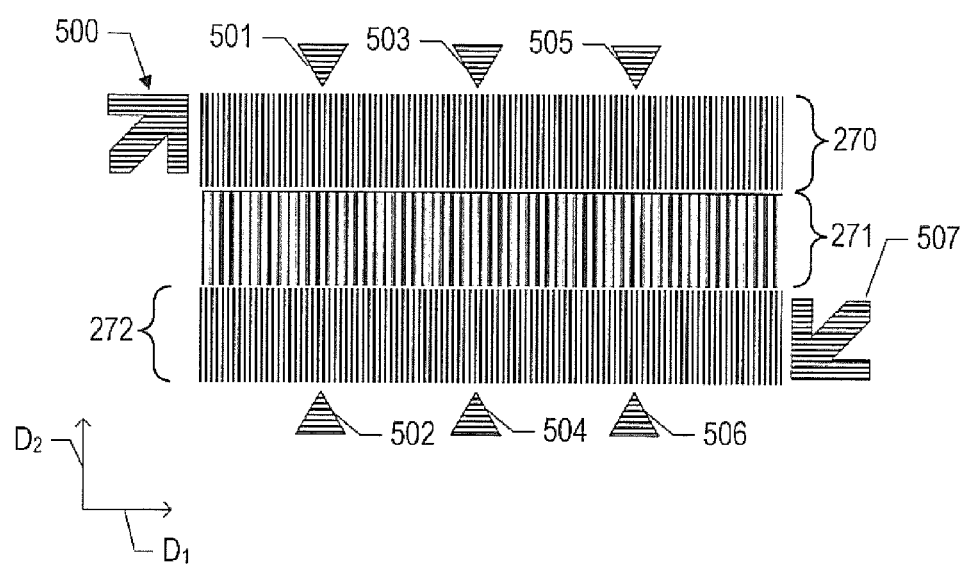
FIG. 14 is a plan view showing the features of FIG. 9 in accordance with an alternate embodiment, in accordance with the present invention.
Figure 15:
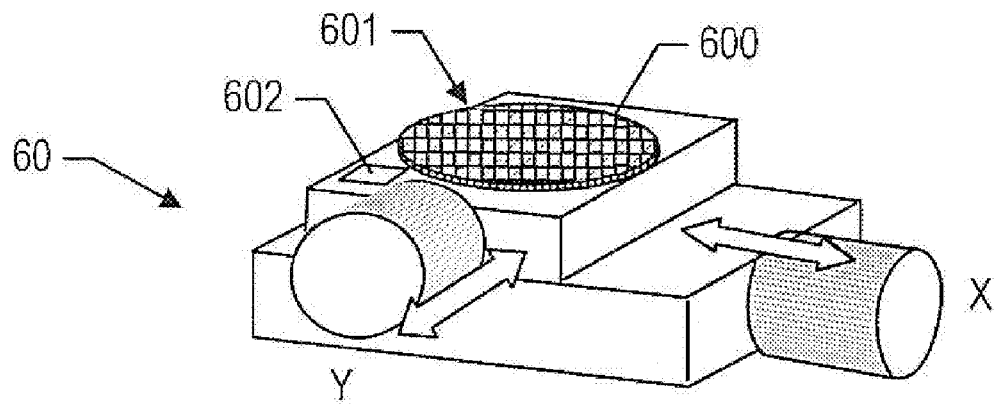
FIG. 15 a simplified perspective view of the stage shown in FIG. 3 in accordance with one embodiment of the present invention.

Referring to FIGS. 4, 11 and 12, in response to sensing images, such as images 469 and 475, each of detectors 72, 82, 92, 102, 112 and 122 produces a signal that is received by processor 130. As a result, six signals are received by processor 130. The following discuss, however described the process with respect to one of the signals generated by detectors 72, 82, 92, 102, 112 and 122 for clarity, with the understanding that the process occurs on each signal produced by the remaining detectors 72, 82, 92, 102, 112 and 122. The signal includes all of the information captured by detectors 72, 82, 92, 102, 112 and 122, i.e., information in the field of view. The field of view of each of detectors 72, 82, 92, 102, 112 and 122 is approximately 758 microns, measured along 477, by 500 microns, measured along 480. A program stored in memory 132 is operated on by processor 130 to identify a region of interest 478 that is a sub-portion of the field of view in which substantially all information other than that concerning sets 470, 471 and 472 is omitted. To that end, the region of interest (ROI) is established to be an even multiple of pixels along both directions: 695 pixels along 479 and 192 pixels along 480. As a result, the dimensions of ROI 478 is a function of the dimensions associated with TAMEs 221, 222, 231, 232, 241, 242, 251 and 252 and TAME 166.

The size of series 470, 471 and 472 corresponds to the size of TAMEs 221, 222, 231, 232, 241, 242, 251 and 252, which is equal to the size of TAME 166. The dimensions of the ROI 478 is established by dividing the width and height associated with SAME 166 and TAMEs 221, 222, 231, 231, 241, 242, 251 and 252 by the size of the pixels of detectors 72, 82, 92, 102, 112 and 122. Additionally, the dimension of ROI 478 along direction 480 is selected so as to be an even multiple of the number of series 470, 471 and 472, which in the present example is three.

Each of the pixels may have a value associated therewith ranging from 0-255. The pixel values are mapped into memory 132 at locations referred to as a memory space. As a result, for each series 470, 471 and 472 is mapped into the memory space as an array having values, from 0 to 255 arranged in 695 columns and 64 rows. Thus, memory 132 has three arrays of values mapped therein corresponding to the image sensed by detectors 72, 82, 92, 102, 112 and 122.

For each of the three arrays mapped into memory space, a one-dimensional array of 695 values is generated. This is accomplished by obtaining, for each of the 695 columns, an average value for the values associated with the 64 rows. This corresponds to a substantially three sinusoidal representations of the information 481, 482 and 483 obtained from series 470, 471 and 472, respectively. Each of the sinusoids are treated as a time varying signal and are mapped into the frequency domain employing a Fast Fourier Transform (FFT) or a Discrete Fourier Transform (DFT) being windowed between addresses corresponding to pixels 0-694. Thereafter, the information in the bin associated with the whole number of periods present in the ROI is analyzed. The ATAN2 function of the values in the aforementioned bins is determined to find the phase value $\phi_1$, $\phi_2$, and $\phi_3$ associated with each sinusoidal signal 481, 482 and 483, respectively. The phase values $\phi_1$, $\phi_2$, and $\phi_3$, having a value of $-\pi$ to $\pi$, are determined with respect to the origin of the region of interest 478, i.e., where the region of interest 478 commences.

A difference in phase values between sinusoids 481, 482 and 483 is determined as follows:

$$\Delta_1 = \phi_1 - \phi_2; \quad\quad 1)$$

$$\Delta_2 + \phi_3 - \phi_2. \quad\quad 2)$$

Although only one of equations 1 and 2 need be solved, the resolution of the phase difference measurements is doubled by obtaining two differential phase measurements. To attenuate, if not vitiate, error attributable to the detectors 72, 82, 92, 102, 112 and 122, an average of the differences determined in equations 1 and 2 is determined as follows:

$$(\Delta_1 - \Delta_2)/2 = \Delta_3. \quad\quad 3)$$

Then the absolute phase difference, $\Delta_4$, between sinusoids 418, 482 and 483 is obtained as follows:

$$\Delta_3/2 = \Delta_4 \quad\quad 4)$$

From equation 4) the corresponding linear displacement, D, between template 56 and mold 198 may be determined from phase $\Delta_4$ as follows:

$$D = P_1 P_2 \Delta_4 / 4\pi (P_1 - P_2) \quad\quad 5)$$

where $P_1$ is the pitch associated with SAME 371, along direction $D_1$, and TAMEs 270 and 272, and $P_2$ is the pitch associated with TAME 271 and SAMEs 370 and 372. In this manner, detectors 72, 82, 92, 102, 112 and 122 facilitate obtaining information concerning six different displacement measurements between region 69 and mold 198, i.e., one measurement from each of regions 200, 202, 204, 206, 212 and 214. From these six displacement measurements, various relative spatial parameters concerning mold 198 and region 69 may be determined as discussed by Armitage, Jr. et al. in *Analysis of Overlay Distortion Patterns*, SPIE Vol. 921, pp. 208-222 (1988), which is incorporated by reference herein. Exemplary spatial parameters are linear misalignment along two orthogonal directions, e.g., the X and Y-directions, rotational misalignment along a third direction extending orthogonal thereto, e.g., the Z-direction. Differences in area, referred to as magnification differences and difference in orthogonality between the perimeter of mold 198 and region 69. The spatial parameters are ascertained as a function of the relation between the ideal location of TAMEs 221, 223, 231, 233, 241, 243, 251 and 253 with respect to the features on mold 198 in reference to the detailed template placement data present in the template design that is typically information defining the placement of features on template and, therefore, mold 198, used when fabricating the template. To that end, information concerning the template placement data is stored in memory 132 to be operated on by processor 130. From the template placement data, the relative spatial parameters may be obtained, using a least squared solution, for the following equations:

$$X_s = X_0 + S_x X_w \cos(\Theta) + S_y Y_w \sin(\Theta) + Y_w \sin(\phi) \quad\quad 6)$$

$$Y_s = Y_0 - S_x X_w \sin(\Theta) + S_y Y_w \cos(\Theta) + X_w \sin(\phi) \quad\quad 7)$$

where $X_s$ is the measured displacement, D, along the X-direction as determined from equation 5 and summed with the $X_w$. The known quantity $X_w$ is the ideal location along the X-direction of the TAME of interest with respect to features of mold 198. Similarly, known quantity $Y_w$ is the ideal location along the Y-direction of the TAME of interest with respect to features of mold 198. Therefore, $Y_s$ is the measured displacement, D, along the Y-direction as determined from equation 5 and summed with the $Y_w$. The variable $X_0$ is the offset between mold 198 and region 69 along the X-direction.

Similarly, the variable $Y_0$ is the offset between mold 198 and region 69 along the Y-direction. Variables $S_x$ and $S_y$ are the differences in between mold 198 and region 69 along the X and Y-directions, respectively. The variable $\ominus$ is the difference in rotational position between mold 198 and region 69 about the Z-direction. The variable $\phi$ is the difference in orthogonality between the perimeter of mold 198 and the perimeter of region 69. As a result, magnification/run out parameters and orthogonality parameters may be determined substantially independent of the distance between mold 198 and region 69, i.e., solely from X-Y displacement parameters.

Specifically, upon determining the relative spatial parameters between mold 198 and region 69, processor 130 generates control signals to regulate the operation of stages 54 and 60 so that desired registration between mold 198 and region 69 is achieved. Registration is demonstrated by detectors 72, 82, 92, 102, 112 and 122 sensing images 469 or 475 shown in FIG. 11 as having a desired offset and FIG. 12 as having no offset, at each of regions 200, 202, 204, 206, 212 and 214. In a typical alignment process the measurements discussed above are taken as the distance between mold 198 and region 69 varies, e.g., becoming closer in proximity along the Z-direction. For example, the measurements and control signals may be generated when mold 198 and region 69 are spaced-apart a distance of 4 microns, 1 micron or a final distance in which a volume is defined therebetween that is substantially filled with polymeric material. As a result, the spatial parameters may be determined and control signals generated in real time during the imprinting process so as to minimize relative spatial parameters between mold 198 and region that are undesirable.

During curing of imprinting material by hardening or cross-linking, the very photons that are needed for curing may also cause heating of mold 198 and region 69. If the intensity of curing light is maintained reasonably uniform, mold 198 and region 69 may heat up uniformly. The differential heating and/or the differential CTE can cause alignment mismatches during exposure up to the point where the imprinting material has not jelled to behave like a solid that adheres to the substrate. However, the average misalignment may either be estimated by simulations or by using the alignment measurement systems described here, and the size of the mold 198 or region 69 can be pre-corrected in such a way that a desired scaling (magnification) mismatch is achieved using the iMAT 62 just prior to curing. It is desirable that the wavelengths used for alignment metrology need to be substantially different from the curing light.

Based upon the foregoing implementation of Fourier analysis to determine the phase of sinusoids 481, 482 and 483, it becomes apparent that the accuracy of these measurements is dependent, in part, upon the proper determining of the ROI 478. This is to ensure that all information concerning series is obtained 470, 471 and 472 are obtained. To that end, it is desired that ROI 478 be established to within a pixel-distance of a corresponding reference point of a reference coordinate system. In the present example, the reference coordinate system is mold 198, but it should be understood that the reference coordinate system may be region 69. As a result, in the present example, the ROI 478 is established to be within a pixel-distance of the corresponding reference point on mold 198. This ensures proper registration of ROI 478 with respect to series 470, 471 and 472.

Desired registration of ROI 478, however, is problematic. This is due to the collection optics associated with each of detectors 72, 82, 92, 102, 112 and 122 being configured to collect first order diffracted wavelengths from regions 200, 202, 204, 206, 212 and 214 propagating along a path that forms an oblique with respect to a normal to mold 198. As a result, light impinging upon regions 200, 202, 204, 206, 212 and 214, from sources 74, 84, 94, 104, 114 and 124, respectively, will result in very little information corresponding to TAMEs 221, 222, 231, 232, 241, 242, 251 and 252, respectively, absent SAME 166 being in superimposition therewith. Furthermore, proper positioning of a SAME 166 in superimposition with one of TAMEs 221, 222, 231, 232, 241, 242, 251 and 252 in the absence of proper registration of regions 200, 202, 204, 206, 212 and 204 with TAMEs 221, 222, 231, 232, 241, 242, 251 and 252 is problematic. One manner to overcome this difficulty is to implement a two step registration process to obtain accurate positioning of region of interest 478. During the first stage course alignment is achieved to within a few pixel sizes of resolution. Specifically, the course alignment scheme should allows the positioning of mold 198 relative to region 69 wafer to within one period 481, 482 and 483. An off-axis imaging system having a high numerical aperture that is linked to iMAT 62 by structural support having a low CTE (example invar or Zerodur materials) is desirable. Also appropriately strong mounts are desired so that the relative location between iMAT 62 and an off-axis camera (not shown) is minimally affected by vibrations. In the present embodiment, the course alignment is achieved by including, on mold 198 a plurality of groups 500-507 of spaced-apart parallel lines defining gratings having a pitch measured orthogonally to the pitch of sets 270, 271 and 272.

Groups 500 and 507 are configured in a shape of an arrow, with the point of group 500 being proximate to a corner of series 270 and the point of group 507 being proximate to a corner of series 272, disposed on a side thereon opposite to group 500. Spaced apart evenly along the $D_1$-direction are groups 501-506, each of which are configured in a triangular shape. The apex of each of groups 501, 503 and 505 are positioned proximate to and faces series 270. The apex of each of groups 502, 504 and 506 is positioned proximate to and faces series 272. The spaced-apart and parallel lines associated with groups 500-507 provide with the requisite pitch and dimensions to facilitate sensing by detectors 72, 82, 92, 102, 112 and 122. Pitches of groups 500-507 may be the same as that of the checkered board so that the $1^{st}$ order, or higher order if so desired, diffracted wavelengths can be collected and sensed by a detector.

Referring to FIGS. 5, 10, 14 and 15, the configuration of groups 500-507 permits locating the ROI 478 to sufficient to enable phase computation, as discussed above. Thereafter, fine alignment occurs by obtaining the absolute phase difference, $\Delta_4$, discussed above, to properly register the field of view with the detectors 72, 82, 92, 102, 112 and 122. To that end, an oversized checkerboard pattern (OCP) 600 is disposed to be in superimposition with mold 198 and may include sets 370, 371 and 372 each if which has features 373 separated by a hiatus 374. The dimensions of any one of sets 370, 371 and 372 may be established to be substantially larger in area than mold 198 area. In this manner, relaxed may be the alignment tolerances to place and one of sets 370, 371 and 372 of OCP 600 in superimposition with one or more of TAMEs 221, 222, 231, 232, 241, 242, 251 and 252. To that end, any one of sets 370, 371 and 372 of OCP 600 may be sufficiently larger so as to be concurrently in superimposition with each of TAMEs 221, 222, 231, 232, 241, 242, 251 and 252 or any subset thereof. With this configuration OCP 600 may be moved along X and Y axes and rotated about Z-axis to be placed in superimposition with one or more TAMEs 221, 222, 231, 232, 241, 242, 251 and 252 and in proper orientation therewith to produce the first order diffraction wavelengths desired to achieve proper registration. Alternatively OCP 600 may include only one of sets 370, 371 and 372. In this fashion, OCP 600 may be coextensive with the area of substrate 56 and placed in region 601 of stage 60 upon which substrate 56 is supported. In this fashion, OCP 600 is merely rotated about Z-axis to facilitate the first order diffraction sensed by detectors to measure proper registration. Alternatively, OCP 600 may be disposed on a region 602 of stage 60, outside of region 601. With this configuration OCP 600 may be moved along X and Y axes and rotated about Z-axis to be placed in superimposition with one or more TAMEs 221, 222, 231, 232, 241, 242, 251 and 252 and in proper orientation therewith to produce the first order diffraction wavelengths desired to achieve proper registration.

Figure 16:
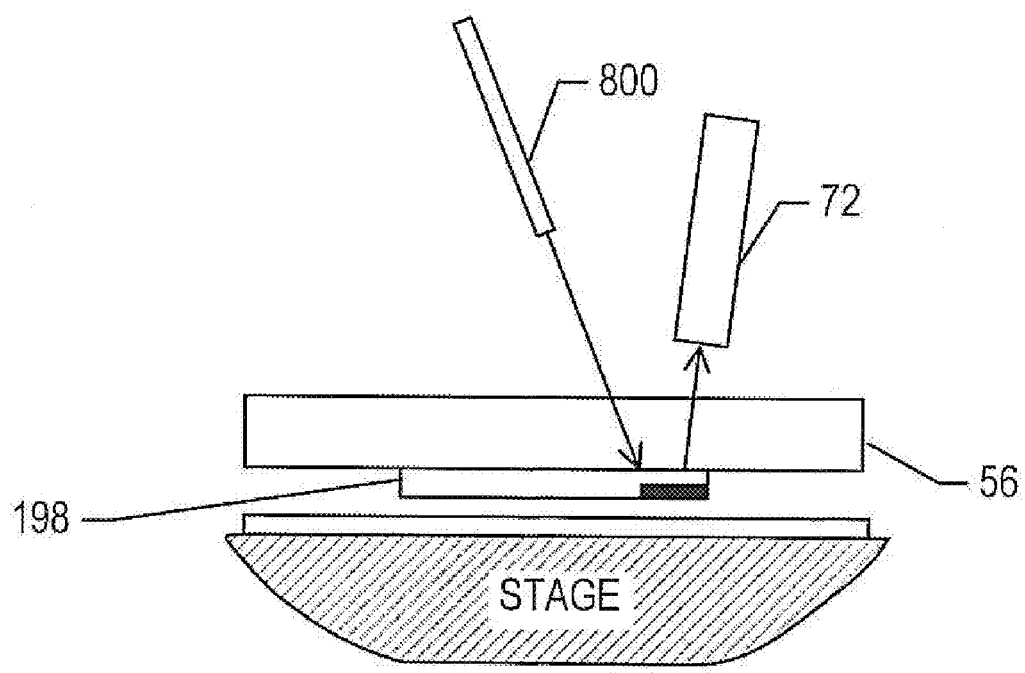
FIG. 16 is a simplified plan view demonstrating one method of course alignment adjustment of a detector with respect to a template alignment mark in accordance with an alternate embodiment of the present invention.

Referring to FIGS. 4, 5 and 16, in an alternative embodiment, proper registration of region of interest 478 may be achieved while omitting plurality of groups 500-507. Specifically, as opposed to first order diffraction wavelengths, the present example employs sensing, by detectors 72, 82, 92, 102, 112 and 122, of specularly reflected light. The present method is discussed with respect to detector 72, but applies equally to the remaining detectors of the plurality of detectors 72, 82, 92, 102, 112 and 122. An illumination source 800 is moved until one of detectors 72, 82, 92, 102, 112 and 122 receives a substantial change in flux of light. To that end, it is desired that region 601 be reflective of the illumination generated by source 800. Upon sensing of the desired flux of energy, the relative positions of detector 72 and source 800 are locked so that both move in synchronization over area of mold 198 to illuminate and sense one of TAMEs 221, 223, 231, 233, 241, 243, 251, 253, in this case TAME 221. Thereafter, the position of detector 72 is fixed with respect to TAME 221 and source 800 is moved to a position so that one of the remaining detectors, e.g., detectors 82, 92, 102, 112 and 122 sense a substantial change in flux of light. Then the process is repeated. After the position of each of detectors 72, 82, 92, 102, 112 and 122 is fixed with respect to TAMEs, 221, 223, 231, 232, 241, 242, 251 and 252, the fine alignment technique discussed above is undertaken to properly register ROI 478.

Referring to FIGS. 5, 6, 17 and 18, SAME 166 and TAMEs 221, 223, 231, 233, 241, 243, 251, 253 may comprise of any number of designs for alignment marks. For example, SAME 766 may include two pairs of spaced-apart gratings elements 767, 768, 769 and 770. As shown grating elements 767 and 769 are coextensive in area, in superimposition with one another along direction $D_2$ and spaced apart from each other along direction $D_1$. Each of grating elements 767 and 769 and each includes a series parallel lines, spaced-apart along direction $D_2$. Grating elements 768 and 770 are coextensive in area, in superimposition with one another along direction $D_1$ and spaced apart from each other along direction $D_2$. Each of gratings 768 and 770 includes a series parallel lines, spaced-apart along direction $D_1$. One or more of TAMEs 221, 223, 231, 233, 241, 243, 251, 253, on the other hand, would include two pairs 866 of spaced-apart gratings elements 867, 868, 869 and 870. As shown grating elements 867 and 869 are coextensive in area, in superimposition with one another along direction $D_2$ and spaced apart from each other along direction $D_1$, a distance that is less than the distance that gratings 767 and 769 are spaced-apart. Each of grating elements 867 and 869 and each includes a series parallel lines, spaced-apart along direction $D_2$. Grating elements 868 and 870 are coextensive in area, in superimposition with one another along direction $D_1$ and spaced apart from each other along direction $D_2$, a distance that is less than the distance that gratings 768 and 770 are spaced-apart. Each of gratings 868 and 870 includes a series parallel lines, spaced-apart along direction $D_1$. With this configuration two pairs 866 are arranged to lie within SAME 766 upon proper registration of mold 198 with substrate region 69, shown as 966 in FIG. 19.

Figure 17:
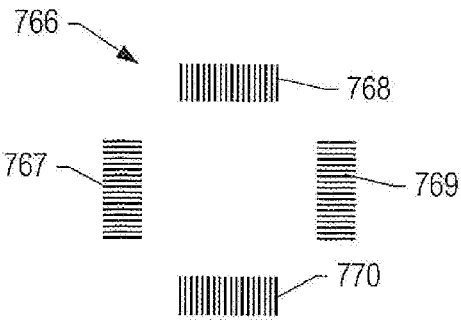
FIG. 17 is a plan view showing features that may be included in substrate alignment mark elements shown in FIG. 3 in accordance with an alternate embodiment.
Figure 18:
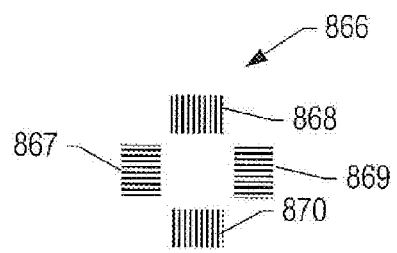
FIG. 18 is a plan view showing multiple series of features that may be included in alignment mark elements shown in FIG. 5 in accordance with an alternate embodiment.
Figure 19:
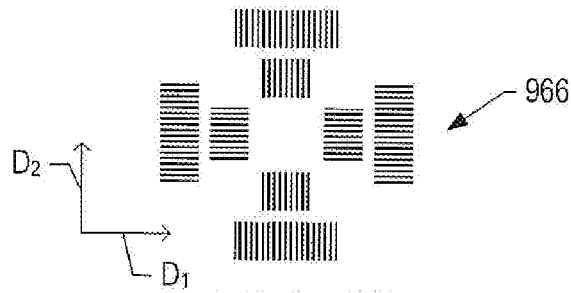
FIG. 19 is a plan view showing the alignment mark configuration resulting from the alignment mark elements shown in FIGS. 17 and 18 upon the same being in superimposition.
Figure 20:
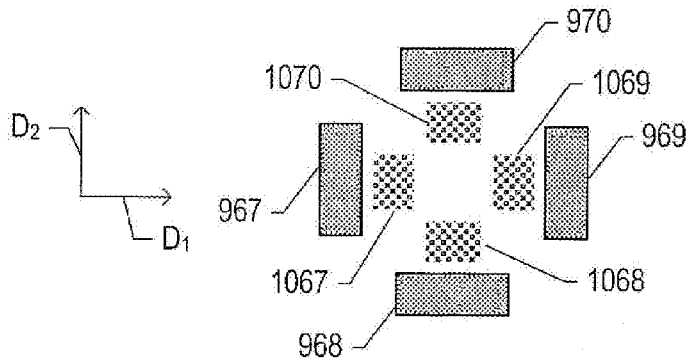
FIG. 20 is a plan view showing the alignment mark configuration shown in FIG. 19 in accordance with a first alternate embodiment.
Figure 21:
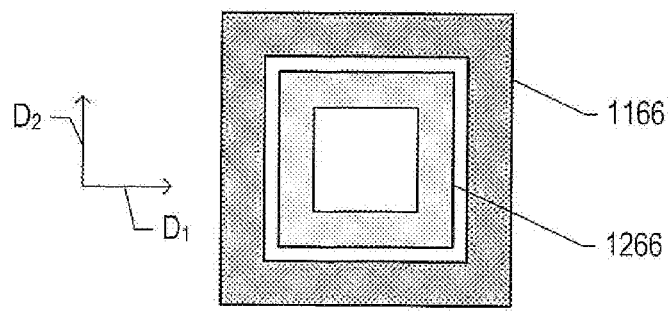
FIG. 21 is a plan view showing the alignment mark configuration shown in FIG. 19 in accordance with a second alternate embodiment.

Referring to FIGS. 17, 18 and 20, it should be understood that each of gratings 766, 767, 768, 769, 868, 867, 869 and 870 may include a checkerboard pattern, as discussed above and shown as gratings 967, 968, 969, 970 and 1067, 1068, 1069 and 1070. Finally, as shown in FIG. 21, gratings 967, 968, 969, 970 may be formed so as to be contiguous, thereby defining a box 1166, as may gratings 1067, 1068, 1069 and 1070, defining box 1266.

The alignment schemes presented here may be used in the presence of optical elements whose parameters are not precisely known without significantly compromising the quality of the measured signals. For example, the template can be nominally 1 to 10 mm thick and the tolerance on its thickness can be 0.1 mm or higher. In addition, the imprint system may have additional windows through which the alignment has to be performed the optical properties of which may vary. For example, a 1 mm thick transparent window may be subjected to air pressure causing it to be stressed by varying amounts during the alignment process.

The embodiments of the present invention described above are exemplary. Many changes and modifications may be made to the disclosure recited above, while remaining within the scope of the invention. For example, each of the above mentioned alignment mark configurations may be imaged using zero order signal provided an inclined illumination source is reflected off of the marks to a detector that is inclined at an equal but opposite angle. Alternatively, these marks may also be created in such a way that their patterned regions are created from parallel lines to enhance the ability to image their first or higher order diffraction signal from an inclined detection system. The SAME regions may be hollow box or cross with a solid box or cross shape for the TAME corresponding thereto, or vice versa, and corresponding target for if the TAME is a universal alignment target. The SAME targets have solid features if zero order imaging is pursued. With inclined illumination, a zero order imaging can be achieved using an inclined collecting optics. If higher order imaging is pursued, the targets may be created as a composite of parallel lines with appropriate orientation as a function of the orientation of the inclined collector optics. Therefore, the scope of the invention should not be limited by the above description, but instead should be determined with reference to the appended claims along with their full scope of equivalents.

What is claimed is:

1. A method, comprising:
   collecting multiple alignment data for a first substrate and a second substrate from phase information using moiré based alignment marks disposed on the first substrate and the second substrate; and
   wherein moiré images are captured by diffracted light from the marks on the first substrate and the second substrate; and
   wherein all imaging microscopes used in the alignment process are positioned outside of a beam path from a UV source and focused through the first substrate to the second substrate.

2. The method of claim 1, wherein the first substrate is positioned at a first distance to the imaging microscope and the second substrate is positioned at a second distance to the imaging microscope, wherein the second distance is greater than the first distance.

3. The method of claim 1, further comprising filling a gap between the first substrate and the second substrate with gas or imprinting fluid.

4. The method of claim 1, further comprising determining relative spatial parameters between the first substrate and the second substrate using multiple alignment data.

5. The method of claim 4, wherein the spatial parameters include alignment, magnification and distortion parameters.

6. The method of claim 1, further comprising imprinting a pattern in a fluid deposited on the second substrate.

7. The method of claim 6, wherein the pattern is imprinted using a UV source and a beam path of the UV source is directed through the first substrate.

8. The method of claim 1, wherein the first substrate is an imprint lithography template.

9. The method of claim 1, wherein the second substrate is a wafer.

10. The method of claim 1, wherein the moiré based alignment marks are disposed on each of the two substrates and a normal distance between at least one moiré based alignment mark positioned on the first substrate and at least one moiré based alignment mark positioned on the second substrate changes from 100 microns to less than 10 nm.

11. A method, comprising:
positioning a first substrate in superimposition with a second substrate;
positioning a UV source in superimposition with the first substrate; and,
determining, by multiple image capturing units, relative spatial parameters between the first substrate and the second substrate, determining the relative spatial parameters including capturing moiré images diffracted into oblique vectors normal to axes of measuring data;
wherein the multiple image capturing units are positioned outside of the UV beam.

12. The method of claim 11, wherein the first substrate is positioned at a first distance to the image capturing units and the second substrate is positioned at a second distance to the image capturing units, wherein the second distance is greater than the first distance.

13. The method of claim 11, further comprising filling a gap between the first substrate and the second substrate with gas or imprinting fluid.

14. The method of claim 11, wherein the relative spatial parameters include alignment, magnification and distortion parameters.

15. The method of claim 11, further comprising imprinting a pattern in a fluid deposited on the second substrate.

16. The method of claim 15, wherein the pattern is imprinted using the UV source.

17. The method of claim 11, wherein the first substrate is an imprint lithography template.

18. The method of claim 11, wherein the second substrate is a wafer.

19. The method of claim 11, wherein each image capturing unit includes a source of illumination and a detector, with the source of illumination directing energy along a path to impinge on the first substrate creating a first order diffraction energy and the detector configured to sense the first order diffraction energy propagating along the path.

20. A method comprising:
positioning a first substrate in superimposition with a second substrate;
positioning a UV source in superimposition with the first substrate; and,
determining, by multiple image capturing units, relative spatial parameters between the first substrate and the second substrate, determining the relative spatial parameters including capturing moiré images diffracted into oblique vectors normal to axes of measuring data, each image capturing unit including a source of illumination and a detector, with the source of illumination directing energy along a path to impinge on the first substrate creating a first order diffraction energy and the detector configured to sense the first order diffraction energy propagating along the path;
wherein the moiré images are captured by diffracted light from a mark on the first substrate and the second substrate; and,
wherein the multiple image capturing units are positioned outside of the UV beam.

* * * * *